United States Patent
Burroughes et al.

(10) Patent No.: US 7,071,612 B2
(45) Date of Patent: Jul. 4, 2006

(54) OPTO-ELECTRICAL DEVICES

(75) Inventors: Jeremy H. Burroughes, Cambridge (GB); Julian C. Carter, Cambridge (GB); Alec G. Gunner, Cambridgeshire (GB); Stephen K. Heeks, Cambridge (GB); Ian S. Millard, Cambridge (GB)

(73) Assignee: Cambridge Display Technology Limited, Cambridgeshire (GB)

( * ) Notice: Subject to any disclaimer, the term of this patent is extended or adjusted under 35 U.S.C. 154(b) by 92 days.

(21) Appl. No.: 10/891,814

(22) Filed: Jul. 15, 2004
(Under 37 CFR 1.47)

(65) Prior Publication Data
US 2005/0001540 A1    Jan. 6, 2005

Related U.S. Application Data

(63) Continuation of application No. 09/913,381, filed as application No. PCT/GB00/00476 on Feb. 14, 2000, now Pat. No. 6,765,350.

(30) Foreign Application Priority Data
Feb. 12, 1999    (GB) ................................ 9903251.8

(51) Int. Cl.
   *H01J 1/62*    (2006.01)
(52) U.S. Cl. ...................... 313/503; 313/504
(58) Field of Classification Search ........ 313/503–506; 362/800, 40, 249, 251, 255; 345/45, 76, 345/36, 39; 315/169.3; 257/40; 349/147
See application file for complete search history.

(56) References Cited

U.S. PATENT DOCUMENTS

| 4,356,429 A | 10/1982 | Tang ........................... 313/503 |
| 4,539,507 A | 9/1985 | VanSlyke et al. ............ 313/504 |
| 5,059,861 A | 10/1991 | Littman et al. .............. 313/503 |
| 5,705,888 A * | 1/1998 | Staring et al. ............... 313/503 |
| 5,739,545 A | 4/1998 | Guha et al. .................... 257/40 |
| 5,747,930 A * | 5/1998 | Utsugi ......................... 313/504 |
| 6,137,223 A | 10/2000 | Hung et al. .................. 313/506 |
| 6,395,409 B1 | 5/2002 | Ueda et al. .................. 428/690 |
| 6,452,218 B1 | 9/2002 | Cao ............................. 257/103 |

FOREIGN PATENT DOCUMENTS

| EP | 0 684 753 A1 | 11/1995 |
| EP | 0 729 191 A2 | 8/1996 |
| EP | 0 822 603 A2 | 2/1998 |
| EP | 0 866 644 A2 | 9/1998 |

(Continued)

OTHER PUBLICATIONS

Tang et al., "Organic Electroluminescent Diodes," *Appl. Phys. Lett.*, 51:913-915 (Sep. 21, 1987).

(Continued)

*Primary Examiner*—Vip Patel
*Assistant Examiner*—Glenn Zimmerman
(74) *Attorney, Agent, or Firm*—Marshall, Gerstein & Borun LLP

(57) ABSTRACT

An opto-electrical device comprising an anode electrode, a cathode electrode, and an opto-electrically active region located between the electrodes, the cathode electrode including a first layer comprising a material having a work function below 3.5 eV, a second layer of a different composition from the first layer, comprising another material having a work function below 3.5 eV, the second layer being further from the opto-electrically active region than the first layer, and a third layer comprising a material having a work function above 3.5 eV, the third layer being further from the opto-electrically active region than the first layer.

28 Claims, 8 Drawing Sheets

FOREIGN PATENT DOCUMENTS

| | | |
|---|---|---|
| EP | 0 869 701 A2 | 10/1998 |
| EP | 1 018 857 A1 | 7/2000 |
| JP | 5003080 | 1/1993 |
| JP | 10020819 | 1/1998 |
| WO | WO 90/13148 | 11/1990 |
| WO | WO 97/08919 | 3/1997 |
| WO | WO 98/10473 | 3/1998 |
| WO | WO 98/10621 | 3/1998 |
| WO | WO 00/48258 | 8/2000 |

OTHER PUBLICATIONS

GB Search Report dated May 6, 1999, in GB 9903251.8 filed Feb. 12, 1999.

International Search Report in PCT/GB00/00476 dated Apr. 10, 2000.

International Preliminary Examination Report in PCT/GB00/00476 dated May 16, 2001.

* cited by examiner

OPTO-ELECTRICAL DEVICES

This is a continuation of U.S. Ser. No. 09/913,381, now U.S. Pat. No. 6,765,350, issued Jul. 20, 2004, which is the U.S. national phase of International Application No. PCT/GB00/00476, filed Feb. 14, 2000, the entire respective disclosures of which are hereby incorporated herein by reference.

FIELD OF THE INVENTION

This invention relates to opto-electrical devices, for example devices for emitting or detecting light

DESCRIPTION OF RELATED ART

One specific class of opto-electrical devices is those that use an organic material for light emission or detection. Light-emissive organic materials are described in PCT/WO90/13148 and U.S. Pat. No. 4,539,507, the contents of both of which are incorporated herein by reference. The basic structure of these devices is a light-emissive organic layer, for instance a film of a poly(p-phenylenevinylene ("PPV"), sandwiched between two electrodes. One of the electrodes (the cathode) injects negative charge carriers (electrons) and the other electrode (the anode) injects positive charge carriers (holes). The electrons and holes combine in the organic layer generating photons. In PCT/WO90/13148 the organic light-emissive material is a polymer. In U.S. Pat. No. 4,539,507 the organic light-emissive material is of the class known as small molecule materials, such as (8-hydroxyquinoline)aluminium ("Alq3"). In a practical device one of the electrodes is typically transparent, to allow the photons to escape the device.

FIG. 1 shows a typical cross-sectional structure of such an organic light-emissive device ("OLED"). The OLED is typically fabricated on a glass or plastic substrate 1 coated with a transparent material such as indium-tin-oxide ("ITO") to form an anode 2. Such coated substrates are commercially available. The ITO-coated substrate is covered with at least a thin film of an electroluminescent organic material 3 and a final cathode layer 4, which is typically a metal or alloy.

Some particularly attractive applications of such devices are as displays in battery-powered units such as portable computers and mobile phones. Therefore, to extend the battery life of such units, there is a particularly strong need to increase the efficiency of the light-emissive devices. One route to improving efficiency is by careful choice and design of the light-emissive material itself. Another is by optimising the physical layout of the display. A third is by improving the conditions for charge injection into and charge recombination in the emissive layer.

To improve the conditions for charge injection into and charge recombination in the emissive layer it is known to include a charge transport layer of an organic material such as polystyrene sulphonic acid doped polyethylene dioxythiophene ("PEDOT-PSS") between one or both of the electrodes and the emissive layer. A suitably chosen charge transport layer can enhance charge injection into the emissive layer and resist reverse flow of charge carriers, which favours charge recombination. It is also known to form the electrodes from materials having work functions that aid the desired flow of charge carriers. For example, a low work function material such as calcium or lithium is preferred as the cathode. PCT/WO97108919 discloses a cathode formed of a magnesium:lithium alloy.

SUMMARY OF THE INVENTION

According to one aspect of the present invention there is provided an opto-electrical device comprising: an anode electrode; a cathode electrode; and an opto-electrically active region located between the electrodes; the cathode electrode including: a first layer comprising a material having a work function below 3.5 eV; a second layer of a different composition from the first layer, comprising another material having a work function below 3.5 eV, the second layer being further from the opto-electrically active region than the first layer; and a third layer comprising a material having a work function above 3.5 eV, the third layer being further from the opto-electrically active region than the first layer.

According to a second aspect of the present invention there is provided a method for forming an opto-electrical device, the method comprising: depositing an anode electrode; depositing over the anode electrode a region of an opto-electrically active material; depositing over the region of opto-electrically active material a material having a work function below 3.5 eV to form a first cathode layer; depositing over the first cathode layer another material having a work function below 3.5 eV to form a second cathode layer of a different composition from the first cathode layer; and depositing over the second cathode layer a material having a work function above 3.5 eV to form a third cathode layer.

The first layer may be adjacent to the opto-electrically active region or there may be one or more other layers (preferably electrically conductive layers) between the first layer and the opto-electrically active region. The opto-electrically active region is suitably in the form of a layer, preferably a layer of an opto-electrically active material. The opto-electrically active region is suitably active to emit light or to generate an electrical field in response to incident light The device is preferably an electroluminescent device.

The thickness of the first layer is suitably less than 50 Å, optionally less than 30 Å, or less than 25 Å or 20 Å. The thickness of the first layer could be less than 15 Å or 10 Å. The thickness of the first layer may be in the range from 5 Å to 20 Å, possibly around 15 Å. More generally, it is preferred that the thickness of the first layer is in the range from 10 Å to 140 Å. The first layer is preferably, but not necessarily thinner, than the second layer.

The thickness of the second layer is suitably less than 1000 Å, and preferably less than 500 Å. The thickness of the second layer is suitably more than 40 Å or 100 Å, and optionally more than 150 Å or 200 Å. The thickness of the second layer is preferably in the range from 40 Å to 500 Å.

The said material having a work function below 3.5 eV of which the first layer is comprised ("the first low work function material") preferably has a higher work function than the said material having a work function below 3.5 eV of which the second layer is comprised ("the second low work function material"), or could alternatively have a lower work function than it. The work functions of the materials as referred to herein are preferably their effective work functions in the device, which may be different from their bulk work functions. Thus the first low work function material preferably has an effective work function in the device of less than 3.5eV and/or the second low work function material preferably has an effective work function in the device of less than 3.5 eV.

One of the first and second low work function materials is preferably a compound or complex of a group 1, group 2 or transition metal. That material is preferably a compound—for example a halide (e.g. a fluoride), oxide, carbide or nitride). That material is preferably a compound of a metal such as Mg, Li, Cs or Y.

The second low work function material may be a metal selected from the following list: Li, Ba, Mg, Ca, Ce, Cs, Eu, Rb, K, Sm, Y, Na, Sm, Sr, Tb or Yb; or an alloy of two or more of such metals; or an alloy of one or more of such metals together with another metal such as Al, Zr, Si, Sb, Sn, Zn, Mn, Ti, Cu, Co, W, Pb, In or Ag.

The first and second low work function materials are preferably different materials. In one preferred embodiment the first low work function material is calcium and the second low work function material is lithium fluoride. In another preferred embodiment the second low work function material is calcium and the first low work function material is lithium fluoride The first low work function material suitably has a (effective) work function less than 3.4 eV, or less than 3.3 eV or less than 3.2 eV, or less than 3.2 eV or less than 3.1 eV or less than 3.0 eV. The second low work function material suitably has a (effective) work function less than 3.4 eV, or less than 3.3 eV or less than 3.2 eV, or less than 3.2 eV or less than 3.1 eV or less than 3.0 eV.

The first low work function material preferably does not cause significant degradation of the material of the active region when the two are in contact. The second low work function material may be a material that is capable of causing degradation of the material of the active region when the two are in contact. The first low work function material may, when in contact with the material of the active region, form an intermediate state between those of the material of the active region and those of the second layer.

The work function of the material of the third layer is preferably greater than 4.0 eV. The higher work function material is suitably a metal or an oxide. The higher work function material and/or the third layer itself preferably has an electrical conductivity greater than $10^5$ $(\Omega \cdot cm)^{-1}$. The higher work function material is preferably Al, Cu, Ag, Au or Pt; or an alloy of two or more of those metals; or an alloy of one or more of those metals together with another metal; or an oxide such as tin oxide or indium-tin oxide (ITO). The thickness of the third layer is preferably in the range from 1000 Å to 10000 Å, preferably in the range from 2000 Å to 6000 Å, and most preferably around 4000 Å.

Suitably more than 50%, more than 80%, more than 90% or more then 95% of the first layer consists of the first low work function material. Preferably the first layer substantially wholly comprises the first low work function material. Most preferably the first layer consists of the first low work function material together with any impurities. Suitably more than 50%, more than 80%, more than 90% or more then 95% of the second layer consists of the second low work function material. Preferably the second layer substantially wholly comprises the second low work function material. Most preferably the second layer consists of the second low work function material together with any impurities. Suitably more than 50%, more than 80%, more than 90% or more then 95% of the third layer consists of the higher work function material. The third layer preferably substantially wholly comprises the higher work function material. Most preferably the third layer consists of the higher work function material together with any impurities.

The second layer is preferably adjacent to the first layer. The third layer is preferably adjacent to the second layer. Alternatively, the cathode may comprise further layers located between the first, second and/or third layers. The cathode is preferably inorganic, most preferably metallic.

One of the electrodes is preferably light-transmissive, and most preferably transparent This is preferably but not necessarily the anode electrode, which could be formed of tin oxide (TO), indium-tin oxide (ITO) or gold.

The opto-electrically active region may be light-emissive or (suitably on the application of a suitable electric field across it) or may be light-sensitive (suitably generating an electric field in response to incident light). The opto-electrically active region suitably comprises a light-emissive material or a light-sensitive material. Such a light-emissive material is suitably an organic material and preferably a polymer material. The light-emissive material is preferably a semiconductive and/or conjugated polymer material. Alternatively the light-emissive material could be of other types, for example sublimed small molecule films or inorganic light-emissive material. The or each organic light-emissive material may comprise one or more individual organic materials, suitably polymers, preferably fully or partially conjugated polymers. Example materials include one or more of the following in any combination: poly(p-phenylenevinylene) ("PPV"), poly(2-methoxy-5(2'-ethyl) hexyloxyphenylene-vinylene) ("MEH-PPV"), one or more PPV-derivatives (e.g. di-alkoxy or di-alkyl derivatives), polyfluorenes and/or co-polymers incorporating polyfluorene segments, PPVs and related co-polymers, poly(2,7-(9, 9-di-n-octylfluorene)-(1,4-phenylene-((4-secbutylphenyl) imino)-1,4-phenylene)) ("TFB"), poly(2,7-(9,9-di-n-octylfluorene)-(1,4-phenylene-((4-methylphenyl)imino)-1, 4-phenylene-((4-methylphenyl)imino)-1,4-phenylene)) ("PFM"), poly(2,7-(9,9-di-n-octylfluorene)-(1,4-phenylene-((4-methoxyphenyl)imino)-1,4-phenylene-((4-methoxyphenyl)imino)-1,4-phenylene)) ("PFMO"), poly (2,7-9,9-di-n-octylfluorene) ("F8") or (2,7-(9,9-di-n-octylfluorene)-3,6-Benzothiadiazole) ("F8BT"). Alternative materials include small molecule materials such as Alq3.

There may be one or more other layers in the device. There may be one or more charge transport layers (preferably of more or more organic materials) between the active region and one or other of the electrodes. The or each charge transport layer may, suitably comprise one or more polymers such as polystyrene sulphonic acid doped polyethylene dioxythiophene ("PEDOT-PSS"), poly(2,7-(9,9-di-n-octylfluorene)-(1,4-phenylene-(4-imino(benzoic acid))-1,4-phenylene-(4-imino(benzoic acid))-1,4-phenylene)) ("BFA"), polyaniline and PPV.

BRIEF DESCRIPTION OF THE DRAWINGS

The present invention will now be described by way of example with reference to the accompanying drawings, in which.

Figure 1:
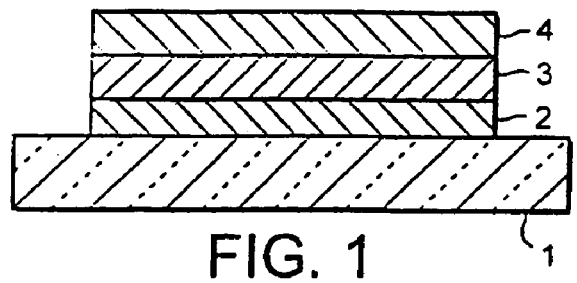
FIG. 1 shows a typical cross-sectional structure of a prior art organic light-emissive device.
Figure 2:
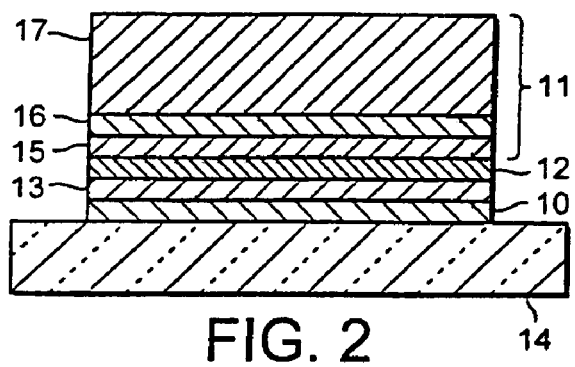
FIG. 2 is a cross-section of a light-emissive device.

The illustrated thicknesses of the layers in FIG. 2 are not to scale.

DETAILED DESCRIPTION OF THE INVENTION

The device of FIG. 2 comprises an anode electrode 10 and a cathode electrode 11. Located between the electrode layers is an active layer 12 of light-emissive material. A charge transport layer 13 of PEDOT:PSS is located between the anode electrode 10 and the light-emissive layer 12. The device is formed on a glass substrate 14.

The metallic cathode 11 comprises three layers. Next to the emissive layer 12 is a first layer 15, of calcium. Over that is a second layer 16, of lithium. Over that is a third layer 17, of aluminium. As will be described below, this structure has been found to provide a significant increase in device efficiency.

To form the device of FIG. 2 a transparent layer of ITO to form the anode electrode 10 may first be deposited on a sheet of glass 14. The glass sheet could be a sheet of sodalime or borosilicate glass of a thickness of, for instance, 1 mm. The thickness of the ITO coating is suitably around 100 to 150 nm and the ITO suitably has a sheet resistance of between 10 and 30 $\Omega/\square$. ITO-coated glass substrates of this type are commercially available. As an alternative to glass, the sheet 14 could be formed of perspex. As an alternative to ITO, gold or TO could be used as the anode.

Over the ITO anode is deposited a hole transport or injecting layer 13. The hole transport layer is formed from a solution containing PEDOT:PSS with a ratio of PEDOT to PSS of around 1 to 5.5. The thickness of the hole transport layer is suitably around 500 Å. The hole transport layer is spin-coated from solution and then baked at around 200° C. for 1 hour in a nitrogen environment.

Then the electroluminescent layer 12 is deposited. In this example, the electroluminescent layer is formed of 20% TFB in 5BTF8. The term 5BTF8 refers to poly (2,7-(9,9-di-n-octylfluorene) ("F8") doped with 5% poly-(2,7-(9,9-di-n-octylfluorene)-3,6-benzothiadiazole) ("F8BT"). The term TFB refers to poly(2,7-(9,9-di-n-octylfluorene)-(1,4-phenylene-((4-secbutylphenyl)imino)-1,4-phenylene)). This mixture is coated over the hole transport layer by spin-coating typically to a thickness of around 750 Å. Other materials such as PPV could be used for the emissive layer. The emissive layer could be formed by other routes such as blade or meniscus coating and could be deposited in precursor form if desired.

The cathode is then deposited. The three distinct layers of the cathode are deposited by successive thermal evaporation steps in vacuo at a base pressure of less than $10^{-8}$ mbar. Preferably the vacuum is not broken between the successive steps, to reduce the possibility of contamination of the interfaces between the layers. One alternative to thermal evaporation is sputtering, but this is less preferred for at least the deposition of the layer 15 adjacent to the emissive layer since it may cause damage to the emissive layer 12. In the first thermal evaporation step the layer 15 is deposited. The layer 15 is of calcium and has a thickness of approximately 5 to 25 Å, preferably around 15 Å. In the second thermal evaporation step the layer 16 is deposited. The layer 16 is of lithium and has a thickness of around 100 to 500 Å. In the third thermal evaporation step the layer 17 is deposited. The layer 17 is of aluminium and has a thickness of around 4000 Å.

Finally, contacts are attached to the layers 10 and 17 and, although the aluminium layer 16 may act to some extent as an encapsulant, the device is preferably sealed in epoxy resin for environmental protection.

In use, when a suitable voltage is applied between the anode and the cathode the light-emissive layer is stimulated to emit light. This passes to a viewer through the transparent anode and the glass cover sheet.

Figure 3:
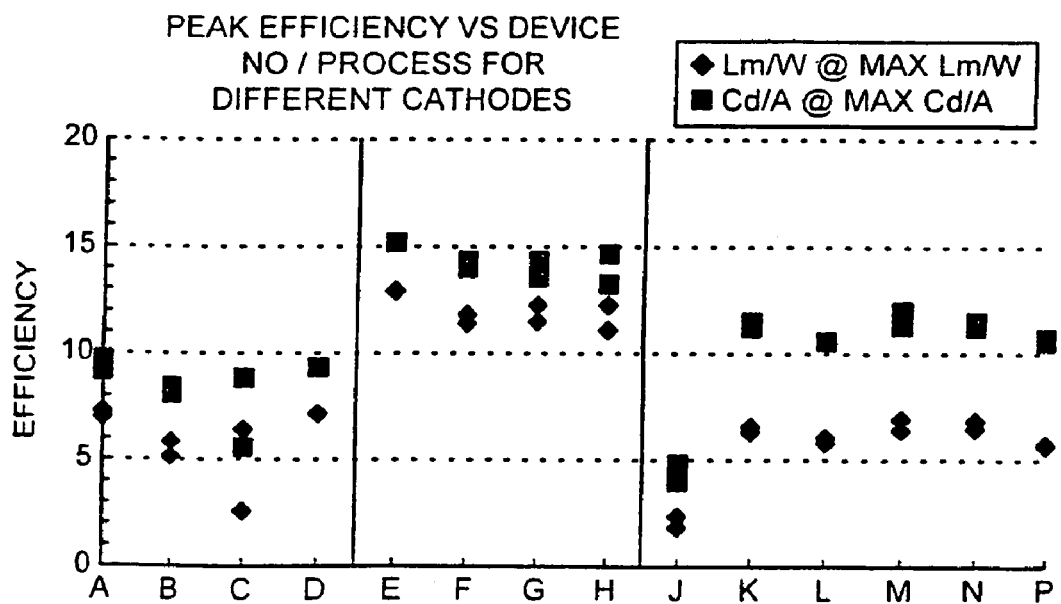
FIGS. 3 to 4 show data on the performance of several light-emissive devices.
Figure 4:
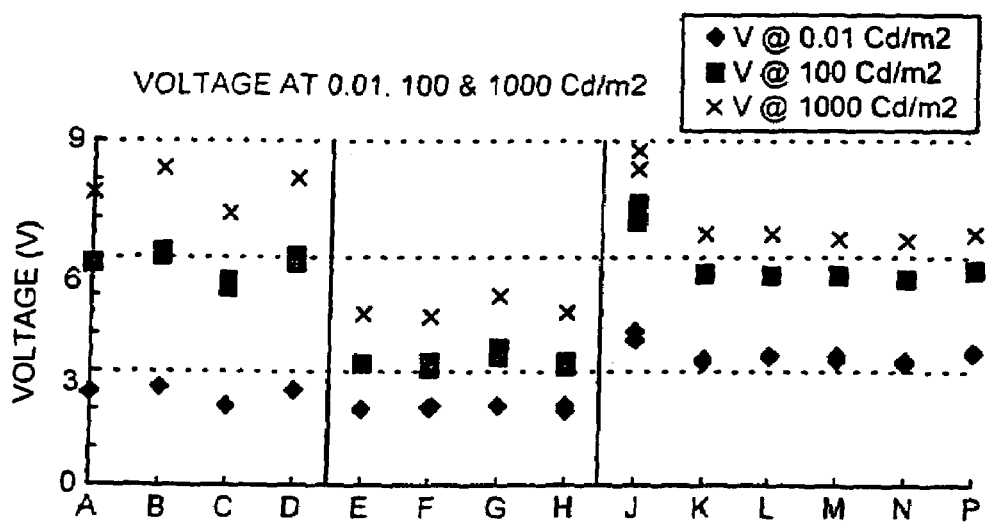

The applicant has found that a device of this type has significantly increased efficiency. FIGS. 3 to 4 show data for the performance of devices of a similar device to that of FIG. 2 (devices E to H) and two comparative device designs (devices A to D and devices J to P).

The common structures of the devices were as follows:
Substrate: glass
Anode: ITO
Charge transport layer 1:5.5 PEDOT:PSS; thickness 500 Å
Emissive layer: 4:1 5BTF8:TFB; thickness 750 Å
The cathodes of the devices were as follows:
Devices A to D:
calcium layer of thickness 500 Å adjacent to emissive layer; and
capping layer of aluminium of thickness 4000 Å.
Devices E to H:
lithium layer of thickness 500 Å adjacent to emissive layer; then
calcium layer of thickness 1000 Å; and
capping layer of aluminium of thickness 4000 Å.
Devices J to P:
lithium layer of thickness 25 Å adjacent to emissive layer; and
capping layer of aluminium of thickness 4000 Å

FIG. 3 shows the peak measured efficiencies of the devices in Lm/W and Cd/A. FIG. 4 shows the drive voltages for the devices at brightnesses of 0.01, 100 and 1000 Cd/m². FIG. 3 shows that the peak efficiency of devices E to H is markedly greater than those of the other devices. FIG. 4 shows that devices E to H do not suffer any significant increase in drive voltage, and have significantly lower drive voltages than devices J to P.

Figure 5:
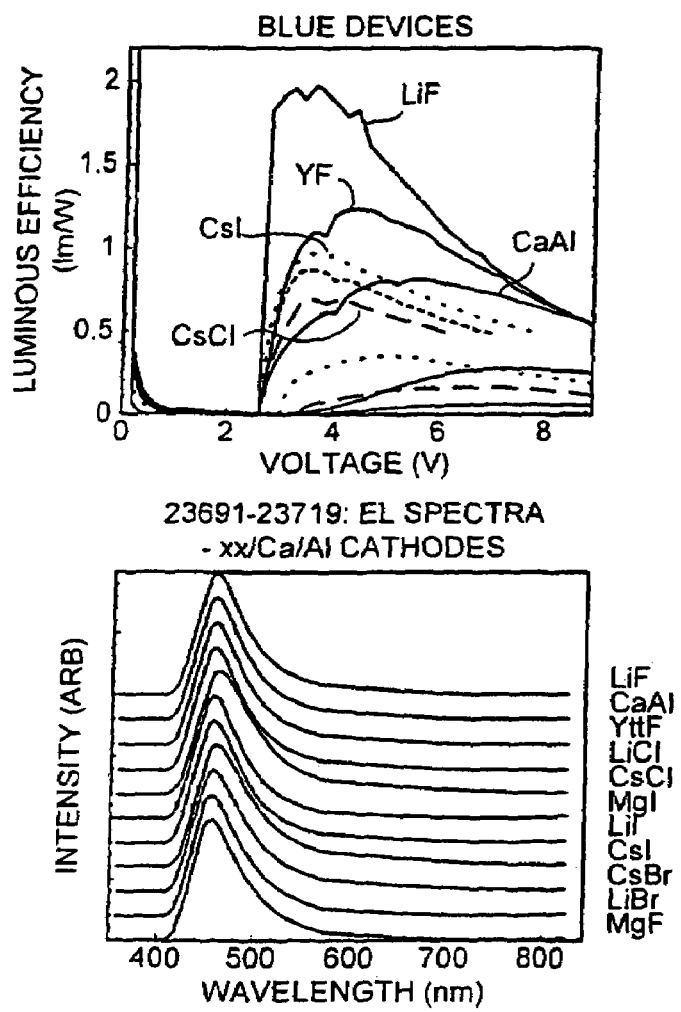
FIGS. 5 and 6 show experimental data for a set of devices having cathodes of different compositions.
Figure 5:
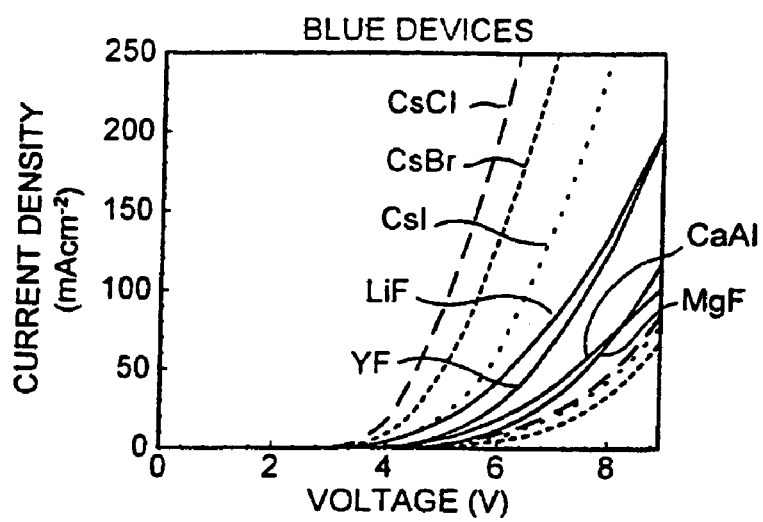
Figure 5:
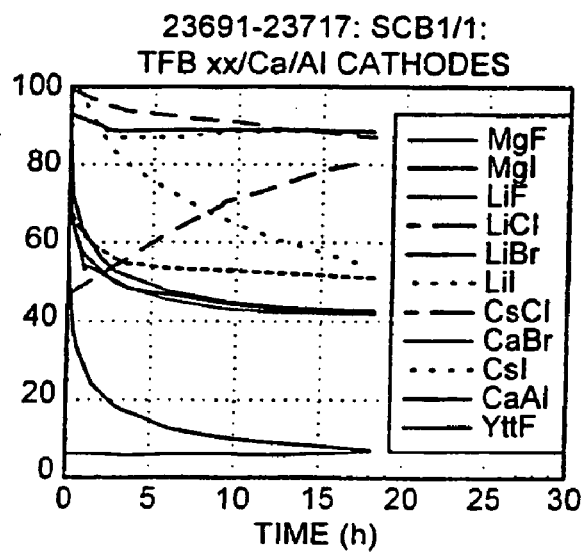
Figure 5:
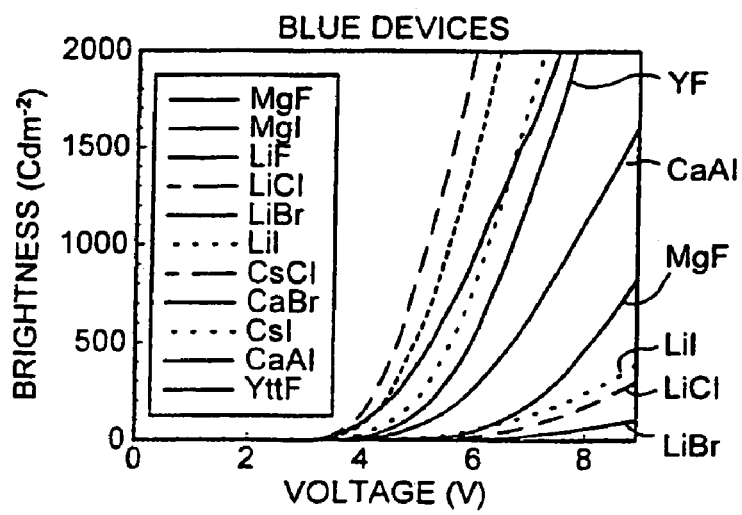
Figure 6:
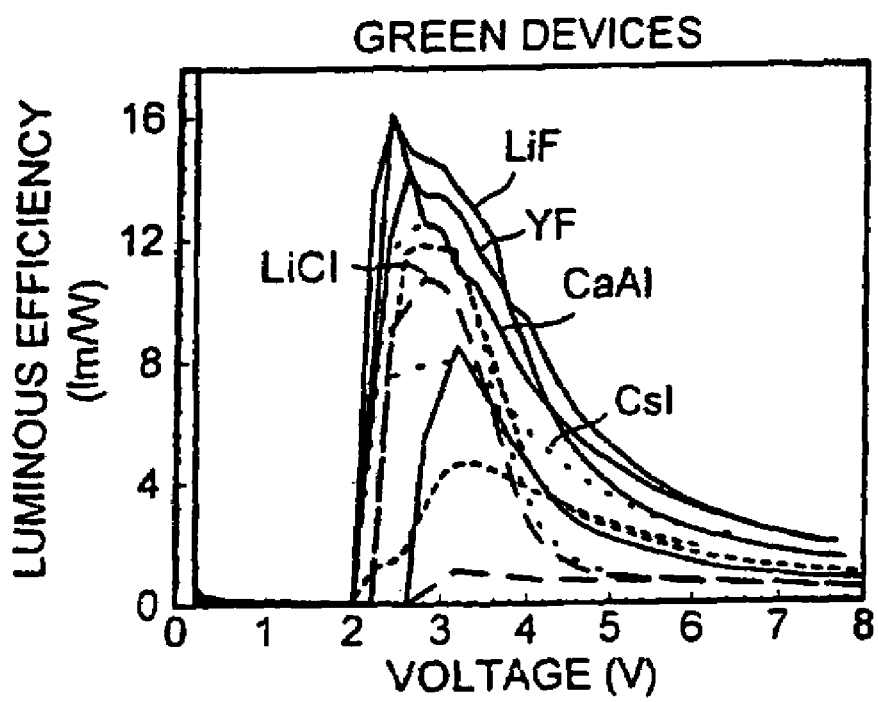
Figure 6:
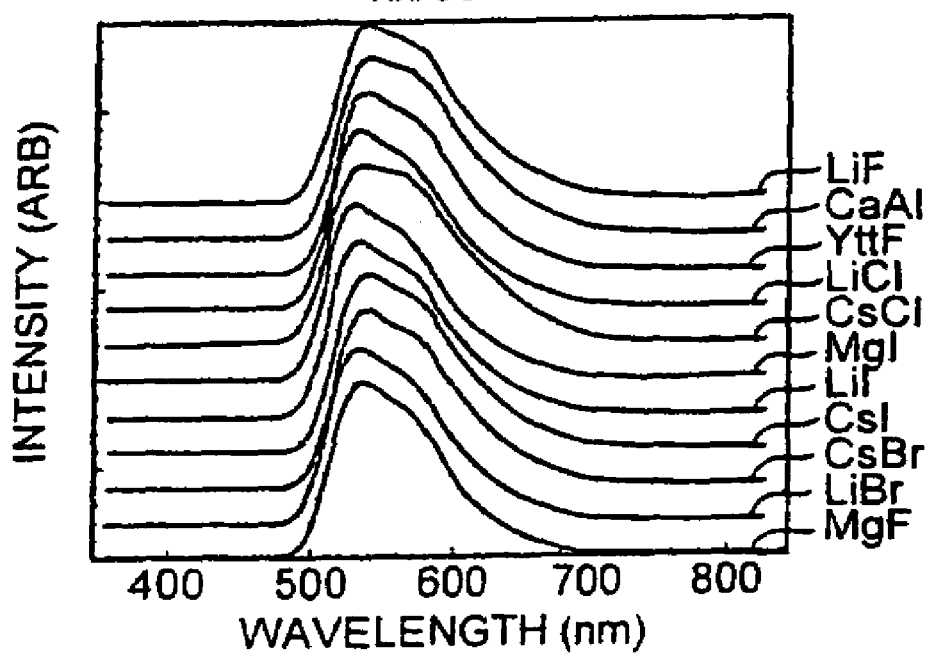
Figure 6:
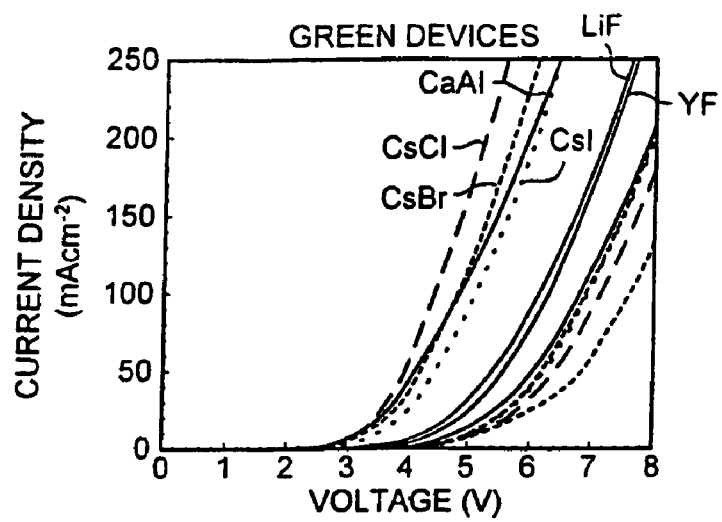
Figure 6:
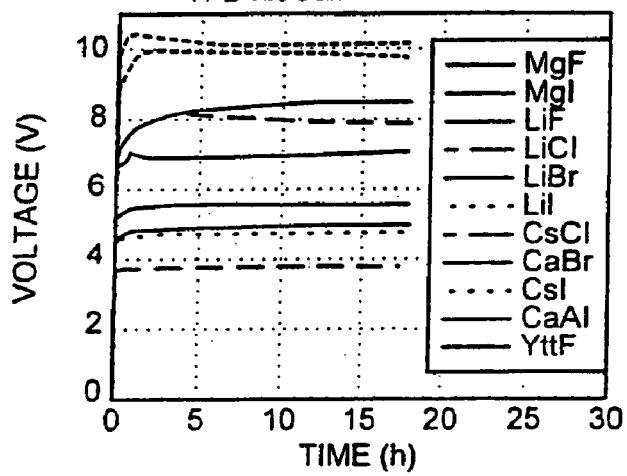
Figure 6:
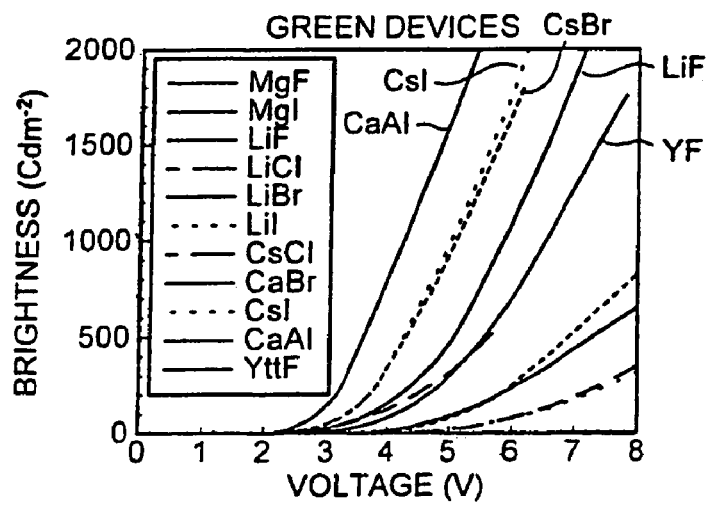

FIGS. 5 to 9 show data for further similar devices. FIG. 5 shows experimental data for devices comprising an ITO anode, an 80 nm layer of PEDOT:PSS, a 63 nm layer of a blue emissive material (spin-coated in a glovebox) and a cathode formed of a first layer next to the emissive layer of a composition as indicated against the respective plot, a second 10 nm layer of Ca and a final layer of Al. FIG. 6 shows experimental data for devices comprising an ITO anode, an 80 nm layer of PEDOT:PSS, a 70 nm layer of a green emissive material (F8:TFB:F8BT spin-coated in a glovebox) and a cathode formed of a first layer next to the emissive layer of a composition as indicated against the respective plot, a second 10 nm layer of Ca and a final layer of Al. The experimental data are: electroluminescence spectra, luminous efficiency against voltage, current density against voltage, brightness against voltage and brightness against time. The efficiency data are summarised as follows:

| Material of first cathode layer | Blue: maximum Lm/W | Green: maximum Lm/W |
| --- | --- | --- |
| $MgF_2$ | 0.30 | 8.5 |
| $MgI_2$ | 0.01 | 0.12 |
| LiF | 2.0 | 15 |
| LiCl | 0.18 | 10 |
| LiBr | 0.05 | 12 |
| LiI | 0.35 | 13 |
| CsCl | 0.60 | 0.9 |
| CsBr | 0.75 | 4.5 |

-continued

| Material of first cathode layer | Blue: maximum Lm/W | Green: maximum Lm/W |
|---|---|---|
| CsI | 0.80 | 8.0 |
| YF | 1.25 | 14 |
| CaAl | 0.73 | 16 |

The EL spectra of the blue emitters were only slightly dependant on the cathode materials used, those with higher current densities showing the typical aggregate feature. Green spectra were relatively independent of the cathode materials used. The device performance appeared to be principally dependant on the metal constituent of the first cathode layer. The Mg-based devices had the worst performance for both emissive polymers, with relatively lo efficiencies and currents. Cs-based devices had intermediate performance. LiF gave the highest performing devices. Other Li halides had relatively poor performance for blue emission and variable efficiency for green.

Figure 7:
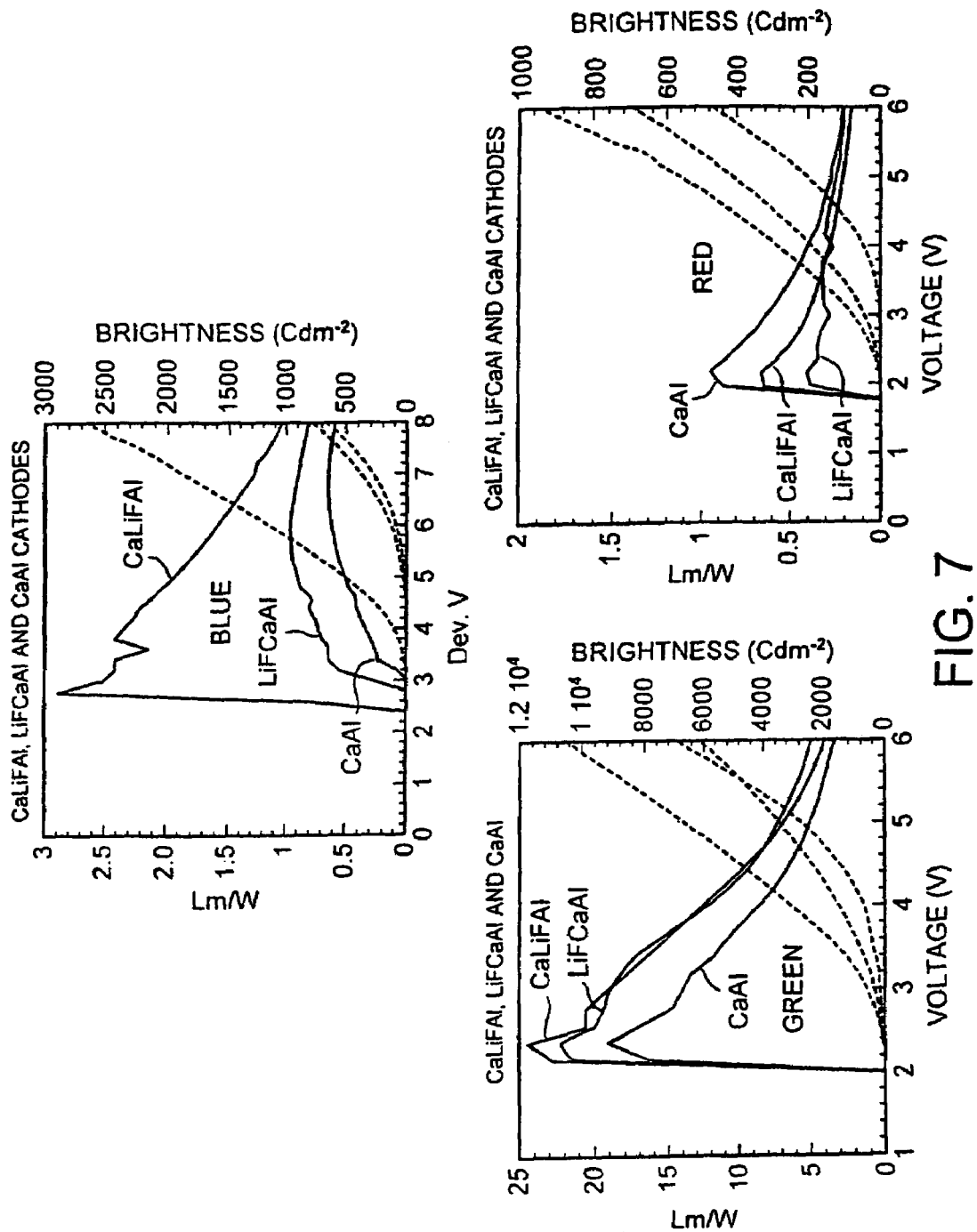
FIG. 7 shows experimental data for a set of devices having cathodes of different configurations.

FIG. 7 shows efficiency data for similar devices having ITO anodes, a PEDOT:PSS layer, an emissive layer capable of emitting blue, green or red light (as indicated on the respective plot) and electrodes of:
(a) a Ca layer adjacent to the emitter and an upper layer of Al;
(b) a LiF layer (6 nm thick) adjacent to the emitter, then a layer of Ca (10 nm thick) and an upper layer of Al;
(c) a Ca layer (5 nm thick) adjacent to the emitter, then a layer of LiF (6 nm thick) and an upper layer of Al.

Figure 8:
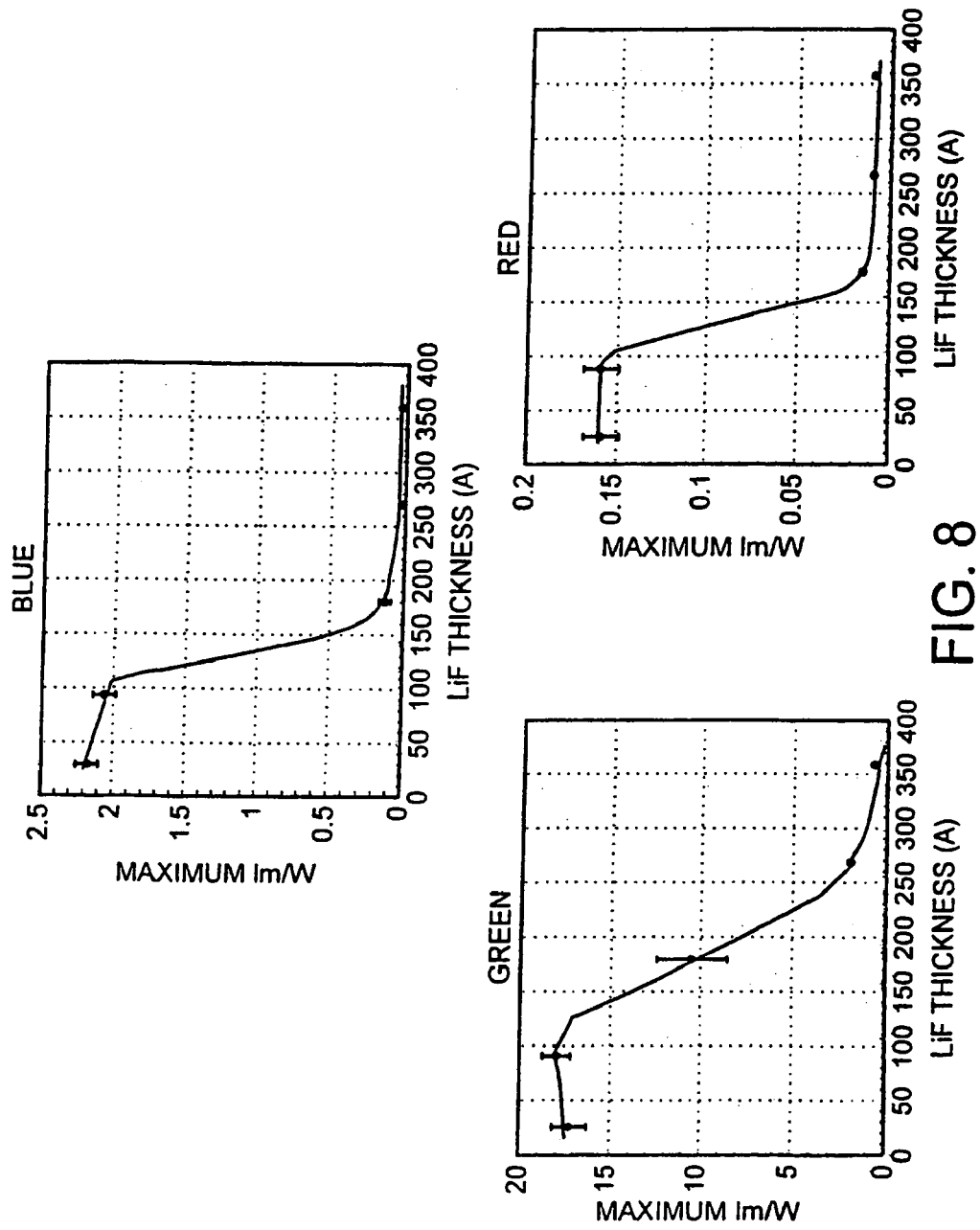
FIGS. 8 and 9 show experimental data for devices having cathode layers of different thicknesses.
Figure 9:
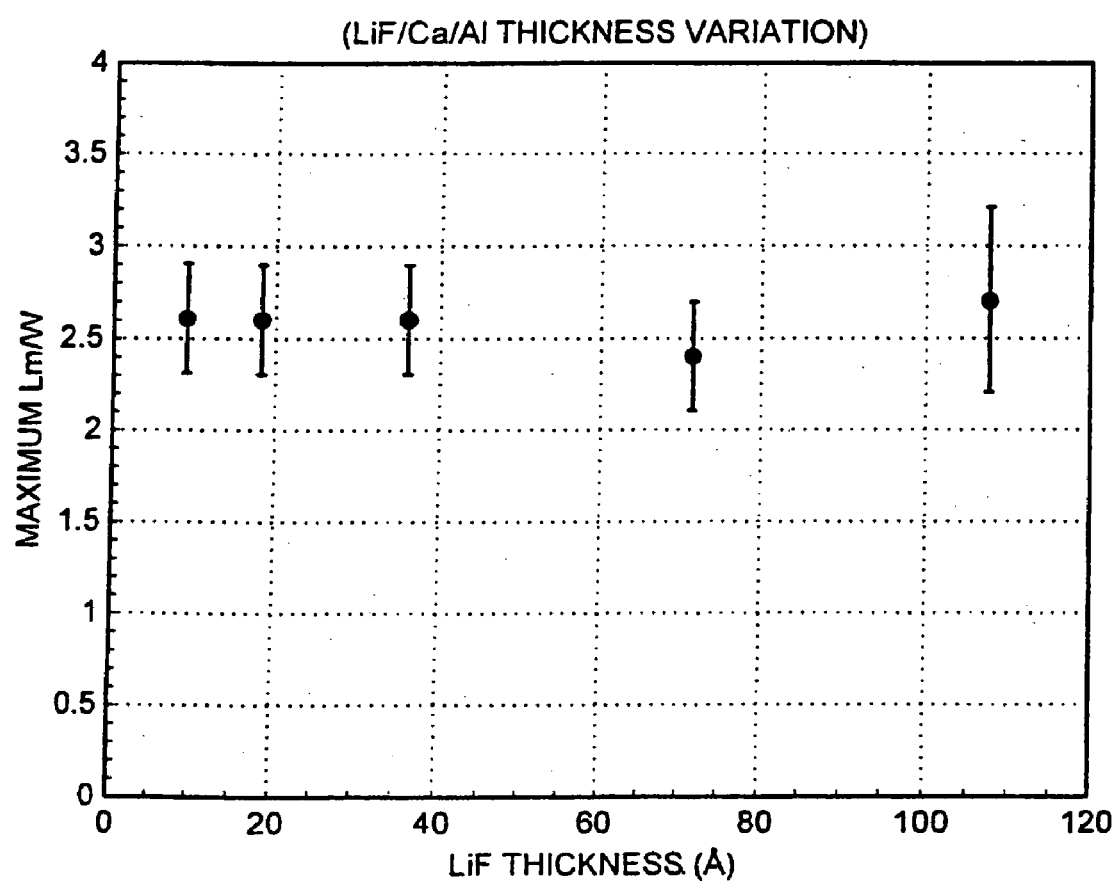

FIG. 8 shows efficiency data as a plot of maximum Lm/W for similar blue, green and red devices having a range of thicknesses for the LiF layer in the Ca/LiF/Al configuration. FIG. 9 shows efficiency data as a plot of maximum Lm/W for devices having a range of thicknesses for the LiF layer in the LiF/Ca/Al configuration.

The applicant has also obtained advantageous results by replacing the Ca layer in such devices with a similar layer of Yb or Ba. Other materials such as Sm, Y and Mg would be expected to yield similar results.

Most of the above devices include in their cathodes a layer of a group 1 or group 2 metal halide, such as LiF. Other group 1 and 2 metal compounds and complexes, such as LiO have been investigated by the applicant and found to give advantageous results. Transition metal halides, compounds and complexes, such as YF (see above) may also give advantageous results. Organic complexes of group 1, group 2 or transition metals may also give advantageous results. These materials include materials that may potentially operate by providing a barrier effect (e.g. LiO) or by another effect due to their low effective work function in this situation (e.g. LiF).

It is believed that, when the layer 15 of the cathode that is adjacent to the emissive layer 12 is sufficiently thin that the properties of the overlying cathode layer 16 can influence charge injection from the cathode into the emissive layer, there is an opportunity to select materials for the layers 15 and 16 such that by a combination of their properties the performance of the device can be enhanced. Possible mechanisms for this enhancement are believed to include: (a) prevention by the layer 15 of adverse interactions between organic layer(s) of the device (e.g. layer 15) and the material of the layer 16, whilst retaining at least some of the injection properties of the material of the layer 16; and (b) the formation by the layer 15 (e.g. with organic layer(s) such as layer 15) of intermediate states that aid electron injection from the layer 16. The layer 15 should be sufficiently thin to allow the effect to occur but sufficiently thick that it can be deposited reproducibly and uniformly (without excessive defects). To exploit possible mechanism (a) the layer 16 could be formed from a material that is more reactive than that of layer 15, but has a lower work function. It should also be noted that highly advantageous performance is also obtained when a layer of a suitable material (e.g. LiF) is spaced slightly from the emissive material, as in the Ca/LiF/Al devices of FIGS. 7 and 8. In general, possible mechanisms include surface induced dipoles, modified work functions, charge transfer formation of chemically stable compounds and dissociation of the compound layer of the cathode to form a doped injection layer.

It should be noted that in assessing experimentally devices of the types described above the upper layer of the cathode (e.g. of Al) provides important protective effects. Instead of Al other suitable materials include Ag or ITO, which have the advantages of being able to provide a transparent layer whereby the whole cathode may be transparent or at least translucent. This is advantageous for devices that are intended to emit through the cathode.

A device of the type described above may form a pixel of a multi-pixel display device.

The devices described above may be varied in many ways within the scope of the present invention. For example, the capping layer 17 could be omitted; the layers could be formed of different materials; additional layers could be present, in the cathode or elsewhere in the device; or one or more additional charge transport layers could be provided between the light-emissive layer and either or both of the electrodes to assist charge transport between the respective electrode and the light-emissive layer and/or to resist charge transport in the opposite direction. The emissive material could be of the class of sublimed molecular films, as described for example in "Organic Electroluminescent Diodes", C. W. Tang and S. A. VanSlyke, Appl. Phys. Lett 51, 913–915 (1987). The locations of the electrodes could be reversed so that the cathode is located at the front of the display (closest to the viewer) and the anode is at the back.

The same principles may be applied to devices for the detection rather than the generation of light. By replacing (if necessary) the light-emissive material with a material that is capable of generating an electrical field in response to light the improved characteristics of the improved electrodes as described above may be used to enhance detection voltages and/or efficiency.

The invention may include any inventive feature or combination of features disclosed herein either implicitly or explicitly or any generalisation thereof, without limitation to the scope of any of the claims. In view of the foregoing description it will be evident to a person skilled in the art that various modifications may be made within the scope of the invention.

What is claimed is:

1. An opto-electrical device comprising:
an anode electrode;
a transparent cathode electrode; and
an opto-electrically active region located between the electrodes;
the cathode electrode including:
a first layer comprising a material having a work function below 3.5 eV;
a second layer of a different composition from the first layer, comprising another material having a work function below 3.5 eV, the second layer being further from the opto-electrically active region than the first layer; and a third layer comprising a material having a work function above 3.5 eV, the third layer being further from the opto-electrically active region than the first layer.

2. An opto-electrical device as claimed in claim 1, wherein one of the first layer and the second layer comprises a compound of a metal selected from the group consisting of group 1 metals, group 2 metals, and transition metals.

3. An opto-electrical device as claimed in claim 2, wherein the compound is a halide.

4. An opto-electrical device as claimed in claim 2, wherein the compound is a fluoride.

5. An opto-electrical device as claimed in claim 2, wherein the metal is a group 1 metal or a group 2 metal.

6. An opto-electrical device as claimed in claim 5, wherein the metal is lithium.

7. An opto-electrical device as claimed in claim 2, wherein the first layer comprises a compound of a metal selected from the group consisting of group 1 metals, group 2 metals, and transition metals.

8. An opto-electrical device as claimed in claim 2, wherein the second layer comprises a compound of a metal selected from the group consisting of group 1 metals, group 2 metals, and transition metals.

9. An opto-electrical device as claimed in claim 2, wherein the other of the first layer and the second layer comprises a metal.

10. An opto-electrical device as claimed in claim 9, wherein the other of the first layer and the second layer comprises a metal selected from the group consisting of Li, Ba, Mg, Ca, Ce, Cs, Eu, Rb, K, Y, Na, Sm, Sr, Tb, and Yb.

11. An opto-electrical device as claimed in claim 1, wherein the second layer is thicker than the first layer.

12. An opto-electrical device as claimed in claim 1, wherein the thickness of the second layer is greater than 100 Å.

13. An opto-electrical device as claimed in claim 1, wherein the material of the first layer has a higher work function than the material of the second layer.

14. An opto-electrical device as claimed in claim 1, wherein the thickness of the third layer is greater than 1000 Å.

15. An opto-electrical device as claimed in claim 1, wherein the material having a work function above 3.5 eV has an electrical conductivity greater than $10^5$ $(\Omega \cdot cm)^{-1}$.

16. An opto-electrical device as claimed in claim 1, wherein the material having a work function above 3.5 eV is selected from the group consisting of aluminium, gold, and indium-tin oxide.

17. An opto-electrical device as claimed in claim 1, wherein the opto-electrically active region is light-emissive.

18. An opto-electrical device as claimed in claim 1, wherein the opto-electrically active region comprises a light-emissive organic material.

19. An opto-electrical device as claimed in claim 18, wherein the light-emissive organic material is a polymer material.

20. An opto-electrical device as claimed in claim 19, wherein the light-emissive organic material is a conjugated polymer material.

21. An opto-electrical device as claimed in claim 18, comprising a charge transport layer between the light-emissive organic material and at least one of the electrodes.

22. An opto-electrical device as claimed in claim 4, wherein the metal is a group 1 metal or a group 2 metal.

23. An opto-electrical device as claimed in claim 22, wherein the metal is lithium.

24. An opto-electrical device as claimed in claim 4, wherein the first layer comprises a compound of a metal selected from the group consisting of group 1 metals, group 2 metals, and transition metals.

25. An opto-electrical device as claimed in claim 4, wherein the second layer comprises a compound of a metal selected from the group consisting of group 1 metals, group 2 metals, and transition metals.

26. An opto-electrical device as claimed in claim 4, wherein the other of the first layer and the second layer comprises a metal.

27. An opto-electrical device as claimed in claim 26, wherein the other of the first and second layers comprises a metal selected from the group consisting of Li, Ba, Mg. Ca, Ce, Cs, Eu, Rb, K, Y, Na, Sm, Sr, Tb and Yb.

28. A method for forming an opto-electrical device, the method comprising:

depositing an anode electrode;

depositing over the anode electrode a region of an opto-electrically active material;

depositing over the region of opto-electrically active material a material having a work function below 3.5 eV to form a first transparent cathode layer;

depositing over the first cathode layer another material having a work function below 3.5 eV to form a second transparent cathode layer of a different composition from the first transparent cathode layer; and depositing over the second transparent cathode layer a material having a work function above 3.5 eV to form a third transparent cathode layer.

* * * * *